United States Patent
Lee et al.

(10) Patent No.: US 12,155,021 B2
(45) Date of Patent: Nov. 26, 2024

(54) PIXEL, METHOD OF MANUFACTURING THE SAME, AND DISPLAY DEVICE INCLUDING THE SAME

(71) Applicant: Samsung Display Co., LTD., Yongin-si (KR)

(72) Inventors: Hyun Wook Lee, Yongin-si (KR); Ki Nyeng Kang, Yongin-si (KR); Ki Bum Kim, Yongin-si (KR); Jin Taek Kim, Yongin-si (KR); Kyung Tae Chae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 690 days.

(21) Appl. No.: 17/222,434

(22) Filed: Apr. 5, 2021

(65) Prior Publication Data
US 2021/0376210 A1    Dec. 2, 2021

(30) Foreign Application Priority Data
Jun. 1, 2020    (KR) .................. 10-2020-0066097

(51) Int. Cl.
| | |
|---|---|
| *H01L 33/62* | (2010.01) |
| *G09G 3/32* | (2016.01) |
| *H01L 25/075* | (2006.01) |
| *H01L 25/16* | (2023.01) |
| *H01L 27/12* | (2006.01) |
| *H01L 27/15* | (2006.01) |
| *H01L 33/18* | (2010.01) |
| *H01L 33/36* | (2010.01) |
| *H01L 33/38* | (2010.01) |
| *H01L 33/54* | (2010.01) |

(52) U.S. Cl.
CPC ............ *H01L 33/62* (2013.01); *H01L 25/167* (2013.01); *H01L 33/54* (2013.01); *H01L 2933/005* (2013.01); *H01L 2933/0066* (2013.01)

(58) Field of Classification Search
CPC ....... H01L 33/62; H01L 33/385; H01L 33/36; H01L 2933/0066; G09G 2300/0439
See application file for complete search history.

(56) References Cited

U.S. PATENT DOCUMENTS

| | | | |
|---|---|---|---|
| 8,765,614 B2 | 7/2014 | Choung et al. | |
| 2020/0026390 A1* | 1/2020 | Gwon .................. | G06F 3/0443 |
| 2021/0167253 A1 | 6/2021 | Basrur et al. | |

FOREIGN PATENT DOCUMENTS

| | | | |
|---|---|---|---|
| KR | 10-2005-0011353 | 1/2005 | |
| KR | 10-2013-0011794 | 1/2013 | |
| KR | 10-1964826 | 4/2019 | |
| KR | 10-2020-0010704 | 1/2020 | |
| KR | 10-2020-0013190 | 2/2020 | |
| WO | WO-2020022596 A1 * | 1/2020 | ......... H01L 25/0753 |

* cited by examiner

*Primary Examiner* — Antonio B Crite
(74) *Attorney, Agent, or Firm* — KILE PARK REED & HOUTTEMAN PLLC

(57) ABSTRACT

A pixel includes a first insulating film disposed on a substrate, a light emitting element disposed on the first insulating film, a second insulating film disposed on the light emitting element to cover at least a portion of the light emitting element, a first contact electrode and a second contact electrode, each of the first and second contact electrodes including at least a portion disposed on the first insulating film and connected to the light emitting element, and an encapsulation layer including a photosensitive material.

11 Claims, 19 Drawing Sheets

PIXEL, METHOD OF MANUFACTURING THE SAME, AND DISPLAY DEVICE INCLUDING THE SAME

CROSS REFERENCE TO RELATED APPLICATION

This application claims priority to and benefit of Korean Patent Application No. 10-2020-0066097 under 35 U.S.C. § 119, filed in the Korean Intellectual Property Office (KIPO) on Jun. 1, 2020, the entire contents of which are incorporated herein by reference.

BACKGROUND

1. Technical Field

The disclosure relates to a pixel, a method of manufacturing the same, and a display device including the same, and more specifically, to a pixel in which contact electrodes spaced apart from each other on a light emitting element are formed in a single process, a method of manufacturing the same, and a display device including the same.

2. Description of Related Art

As interest in an information display and a demand for using a portable information media are increasing, demands and commercialization for a display device have been focused on.

SUMMARY

An object of the disclosure is to provide a pixel for which some of a process step may be omitted and thus a required cost is reduced, a method of manufacturing the same, and a display device including the same.

Another object of the disclosure is to provide a pixel in which formation of a contact electrode is easy, a method of manufacturing the same, and a display device including the same.

The objects of the disclosure are not limited to the above-described objects, and other technical problems which are not described will be clearly understood by those skilled in the art from the following description.

According to an embodiment of the disclosure, a pixel may be provided. The pixel may include a first insulating film disposed on a substrate, a light emitting element disposed on the first insulating film, a second insulating film disposed on the light emitting element to cover at least a portion of the light emitting element, a first contact electrode and a second contact electrode, each of the first and second contact electrodes including at least a portion disposed on the first insulating film and electrically connected to the light emitting element, and an encapsulation layer including a photosensitive material. Each of the first contact electrode and the second contact electrode may be disposed on corresponding ones of side surfaces of the second insulating film, and may not be in contact with each other on an upper surface of the second insulating film, and the encapsulation layer may be disposed on the first contact electrode and the second contact electrode.

In an embodiment, a height of the second insulating film with respect to a main surface of the light emitting element may be equal to or greater than a height of the first contact electrode and a height of the second contact electrode.

In an embodiment, the first contact electrode may include a distal end that is in physical contact with the second insulating film and that is spaced apart from the light emitting element. The second contact electrode may have a distal end that is in physical contact with the second insulating film and that is spaced apart from the light emitting element. Each of the distal end of the first contact electrode and the distal end of the second contact electrode may be spaced apart by an equal distance from the substrate.

In an embodiment, top surfaces between the distal end of the first contact electrode and the distal end of the second contact electrode may be parallel to the main surface of the substrate.

In an embodiment, the first contact electrode and the second contact electrode may be disposed on the light emitting element and may not be disposed on the upper surface of the second insulating film.

In an embodiment, the encapsulation layer may not be disposed on the second insulating film.

In an embodiment, the encapsulation layer may include a first encapsulation region and a second encapsulation region. The first encapsulation region may be adjacent to the second insulating film compared to a the second encapsulation region. The first encapsulation layer in the first encapsulation region, the first contact electrode, and the second contact electrode may have a same height.

In an embodiment, the second insulating film may a first material, and the pixel may further include a third insulating film and a fourth insulating film, each of the third insulating film and the fourth insulating film being disposed on the first insulating film, including the first material, and spaced apart from each other.

In an embodiment, at least a portion of the first contact electrode may be disposed on a first side surface of the second insulating film, and at least a portion of the second contact electrode may be disposed on a second side surface of the second insulating film, the second side surface being opposite to the first side surface.

In an embodiment, the encapsulation layer, the first contact electrode, the second contact electrode, and the second insulating film may be provided by a photolithography process by using a mask including at least a halftone region, and a region of the upper surface of the second insulating film may correspond to the halftone region of the mask during the photolithography process in a plan view.

According to another embodiment of the disclosure, a method of manufacturing a pixel may be provided. The method may include forming a first electrode and a second electrode to be spaced apart from each other on a substrate, forming a first insulating film on the first and second electrodes, disposing a light emitting element on the first insulating film, forming a second insulating film to cover at least a portion of the light emitting element, depositing a contact electrode to be electrically connected to the light emitting element and to cover at least an upper surface of the second insulating film, applying a photosensitive material on a first material obtained through the depositing of the contact electrode, removing at least a portion of the photosensitive material by using a mask including at least a halftone region; and removing at least a portion of the contact electrode disposed on the upper surface of the second insulating film by using a second material as an etching mask, wherein the second material may be obtained in the removing of the at least a portion of the photosensitive material.

In an embodiment, after the removing of the portion of the contact electrode, removing the photosensitive material from which the at least a portion was removed may not be performed.

In an embodiment, the removing of the at least the portion of the photosensitive material may include arranging the halftone region of the mask to correspond to the upper surface of the second insulating film in a plan view.

In an embodiment, the depositing of the contact electrode may include forming the contact electrode to include a first contact electrode, a second contact electrode, and a third contact electrode; forming the first contact electrode and the second contact electrode to be disposed at a position corresponding to the upper surface of the second insulating film; and forming the third contact electrode not to be disposed at a position corresponding to the upper surface of the second insulating film. The removing of at least the portion of the contact electrode may include removing the third contact electrode.

In an embodiment, the first contact electrode and the second contact electrode may be formed at a same time.

In an embodiment, the method may further include after the removing of at least the portion of the contact electrode, forming each of the first and second contact electrodes to have an equal height with respect to a main surface of the substrate.

In an embodiment, the forming of the second insulating film may include forming the second insulating film on each of a surface of the light emitting element, the first insulating film on the first electrode, and the second insulating film on the second electrode.

According to still another embodiment of the disclosure, a display device including the pixel may be provided.

The disclosure is not limited to the above-described embodiments, and other embodiments that are not described may be clearly understood by those skilled in the art from the specification and the accompanying drawings.

According to embodiments of the disclosure, a process for a contact electrode, which has been performed separately, may be performed in a single procedure, and thus a pixel having a reduced process cost, a method of manufacturing the same, and a display device including the same may be provided.

According to another embodiment of the disclosure, a contact electrode, an insulating film, and the like are formed using a halftone mask, and a pixel in which the contact electrode is readily formed, a method of manufacturing the same, and a display device including the same may be provided.

The effect of the disclosure is not limited to the above-described effect, and effects which are not described will be clearly understood by those skilled in the art from the specification and the accompanying drawings.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
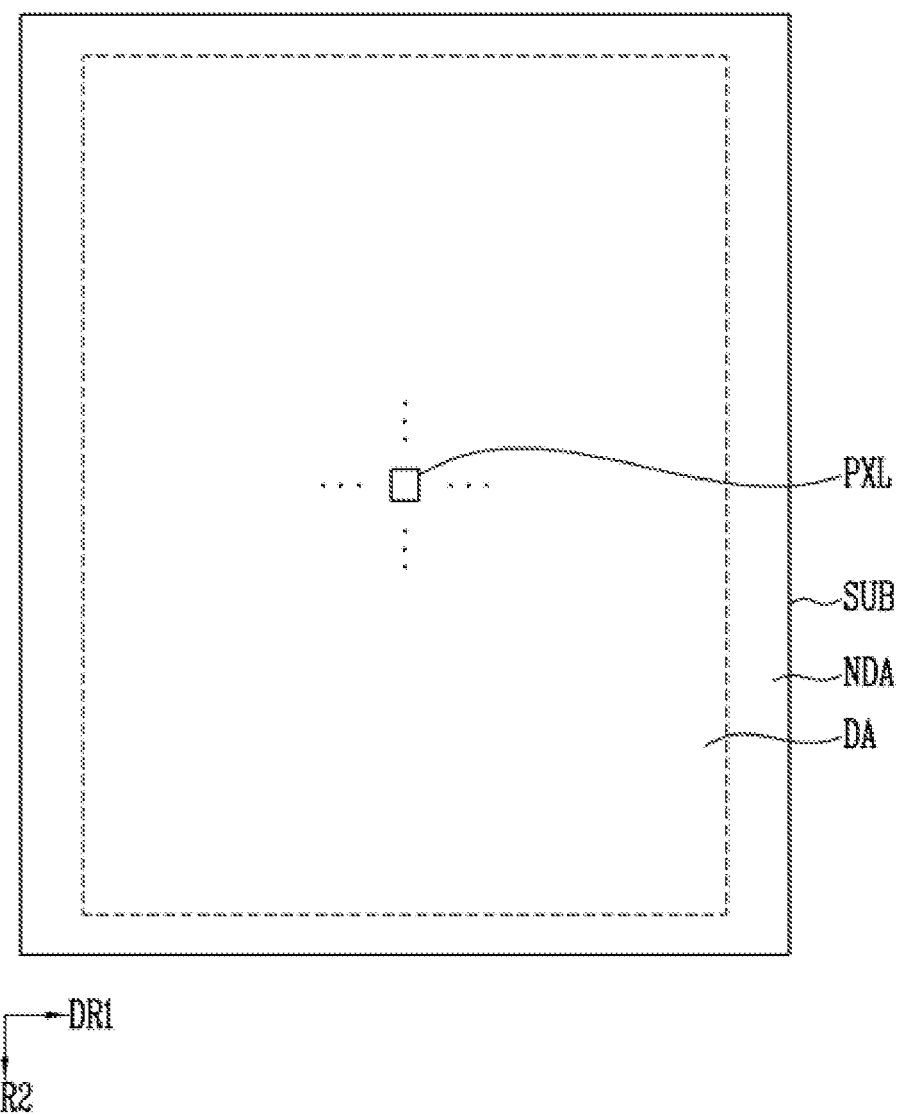
FIG. 1 is a schematic plan view illustrating a display device including a pixel according to an embodiment of the specification.

Since the embodiment described in the specification is for clearly describing the spirit of the disclosure to those skilled in the art to which the disclosure pertains, the disclosure is not limited by the embodiment described in the specification, and the scope of the disclosure should be interpreted as including modifications or variations that do not depart from the spirit of the disclosure.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The drawings attached to the specification are intended to readily describe the disclosure. Since the elements shown in the drawings may be exaggerated and illustrated to help understanding of the disclosure, the disclosure is not limited by the drawings.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification, when it is determined that detailed description of a known configuration or function related to the disclosure may obscure the subject matter of the disclosure, detailed description thereof may be omitted.

The disclosure relates to a pixel, a method of manufacturing the same, and a display device including the same, and more specifically, to a pixel in which contact electrodes spaced apart from each other on a light emitting element are formed in a single process, a method of manufacturing the same, and a display device including the same.

According to still another embodiment of the specification, a display device including the pixel may be provided.

Hereinafter, a pixel according to an embodiment of the specification will be described with reference to FIGS. 1 to 11, 12A, and 12B.

FIG. 1 is a schematic plan view illustrating a display device including a pixel according to an embodiment of the specification.

The display device refers to a device configured to provide visual data to a user. The display device defined in the specification refers to a device including a light emitting element configured to emit light in case that an electrical signal is applied. For example, the display device including a pixel according to the embodiment of the specification is not limited to a specific application object such as a tablet PC, a television, a smart phone, and a laptop.

Referring to FIG. 1, the display device 1 may include a substrate SUB, a display area DA, a non-display area NDA, a pixel PXL, a driving portion (not shown), and a line portion (not shown).

The substrate SUB may include the display area DA and the non-display area NDA.

The display area DA and the non-display area NDA may be physically divided.

The pixel PXL may be positioned in the display area DA.

The driving portion and the line portion may be positioned in the non-display area NDA.

Multiple pixels PXL may be disposed on the substrate SUB. For example, although only a single pixel is shown in FIG. 1 for convenience, the display device 1 may include pixels PXL.

The substrate SUB may include a rigid material or a flexible material according to the purpose of the display device 1. However, the material of the substrate SUB applied to the embodiment of the disclosure is not limited to a specific example.

In a plan view, the display area DA may be included in an area of the substrate SUB. According to an example, the display area DA may be positioned in a center area of the substrate SUB.

The display area DA may be an area where visual data is displayed to the outside. The display area DA may refer to an area where the pixel PXL is positioned.

In a plan view, the non-display area NDA may be included in an area of the substrate SUB. The non-display area NDA may refer to an area where the pixel PXL is not positioned.

In a plan view, the non-display area NDA may not overlap the display area DA. For example, the non-display area DA may be positioned in an area surrounding or adjacent to an outer surface of the display area DA.

The pixel PXL may be disposed on the substrate SUB. The pixel PXL may be disposed in the display area NDA.

The pixel PXL may include at least one light emitting element LD (a light emitting diode). The light emitting element LD may function as a light source that emits light in case that an electric signal is applied. Details of specific structure, operation, and function of the light emitting element LD will be described below with reference to FIG. 5.

In a plan view, the driving portion may be positioned in the non-display area NDA. The driving portion may output electrical signal provided to the pixel PXL. In case that the electrical signal is provided to the pixel PXL, the light emitting element LD included in the pixel PXL may emit light. Details of a circuit diagram illustrating a specific electrical signal flow of the driving portion will be described below with reference to FIG. 4.

In a plan view, the line portion may be positioned in the non-display area NDA.

The line portion may electrically connect the driving portion with the pixel PXL.

Hereinafter, a pixel according to an embodiment of the specification will be described in detail with reference to FIGS. 2 to 5.

Figure 2:
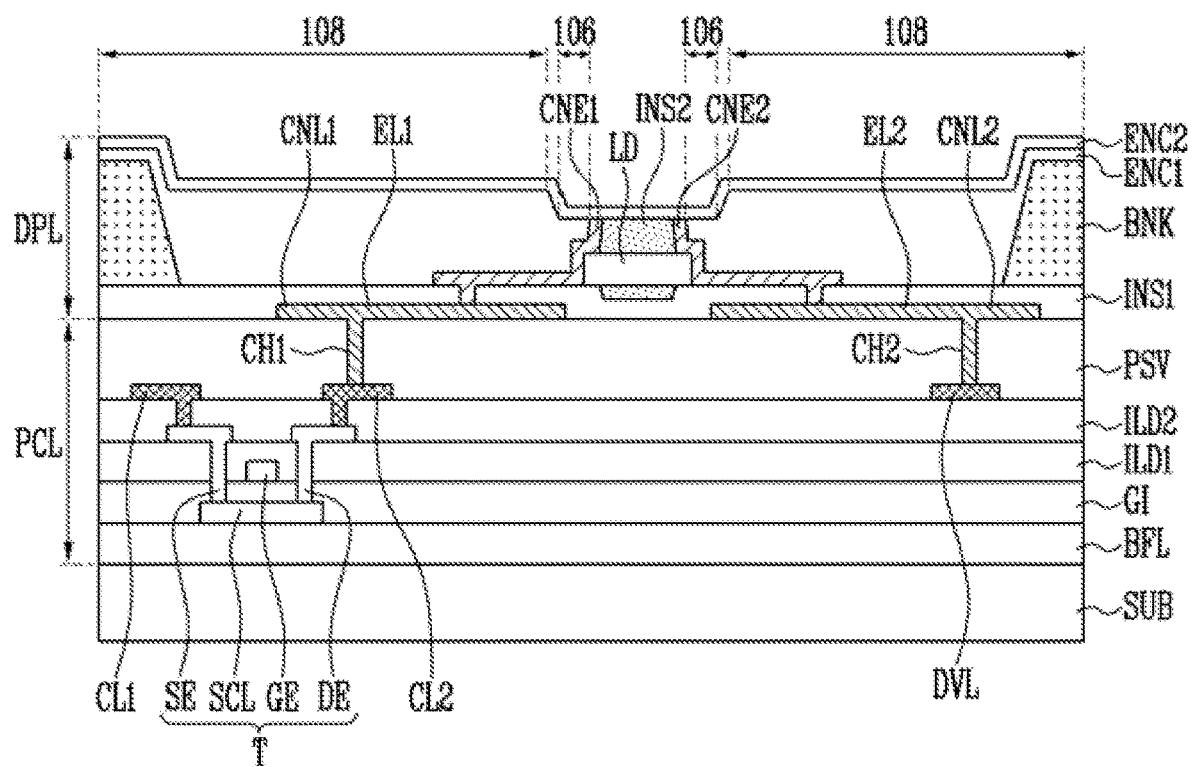
FIG. 2 is a schematic cross-sectional view illustrating a structure of a pixel according to an embodiment of the specification.

FIG. 2 is a schematic cross-sectional view illustrating a structure of a pixel according to an embodiment of the specification.

Referring to FIG. 2, the pixel (refer to "PXL" of FIG. 1) may include a pixel circuit unit PCL and a display element unit DPL.

The pixel circuit unit PCL may include a pixel driving circuit including at least one transistor. Hereinafter, the pixel driving circuit will be described with reference to FIG. 4.

Figure 4:
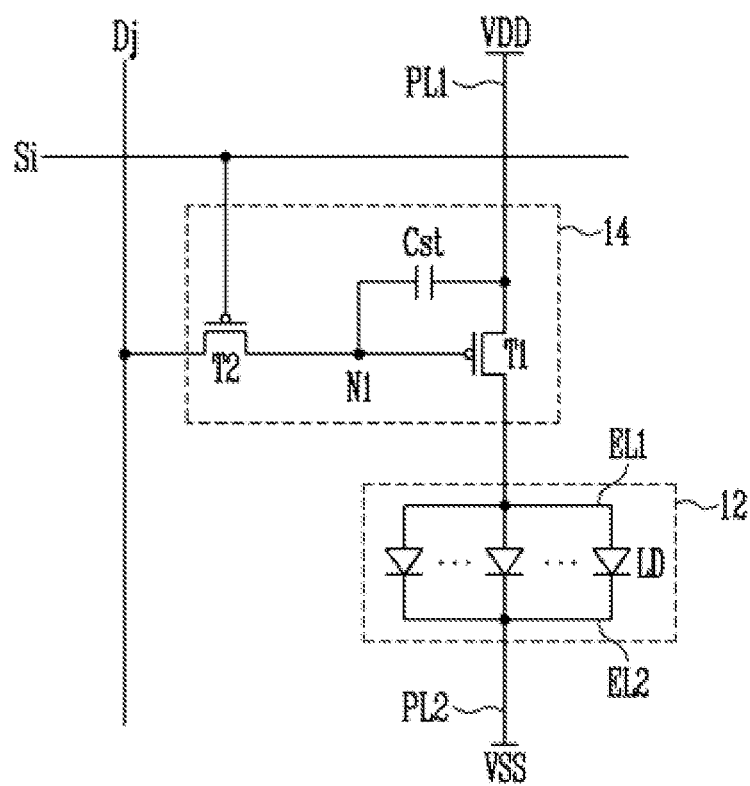
FIG. 4 is a schematic circuit diagram illustrating a pixel driving circuit for operating a light emitting element included in a pixel according to an embodiment of the specification.

FIG. 4 is a schematic circuit diagram illustrating an electrical connection relationship of the pixel driving circuit for operating a light emitting element included in a pixel according to an embodiment of the specification.

Hereinafter, an example electrical connection relationship related to the pixel driving circuit will be described. However, the pixel driving circuit of the disclosure is not limited to the example described electrical connection relationship, and an additional electrical element may be included or variously modified and implemented. The described transistor is not limited to a transistor of a specific type.

The light emitting element unit 12 may be electrically connected to first driving power VDD through a first power line PL1 and may be electrically connected to second driving power VSS through a second power line PL2.

The light emitting element unit 12 may include a light emitting element LD. The light emitting element LD may be disposed between a first electrode EL1 and a second electrode EL2 in case that a flow direction of an electrical signal is referenced.

At this time, in case that the first electrode EL1 is an anode electrode, the second electrode EL2 may be a cathode electrode. As another example, in case that the first electrode EL1 is a cathode electrode, the second electrode EL2 may be an anode electrode.

The light emitting element unit 12 may include light emitting elements LD. In case that multiple light emitting elements LD are included, the light emitting elements LD may be arranged in a predetermined manner. For example, the light emitting elements LD may be arranged in parallel with respect to a potential application point of the first driving power VDD and the second driving power VSS (refer to an arrangement shown in FIG. 4). However, an arrangement form of the light emitting elements LD is not limited to the above-described example and may have various arrangement forms such as series connection.

The first driving power VDD and the second driving power VSS may have different potentials. In case that a potential difference equal to or greater than a predetermined threshold voltage is applied to the light emitting element LD due to a potential difference between the first driving power VDD and the second driving power VSS, the light emitting element LD may emit light. For example, each light emitting element LD may emit light based on the potential difference between the first driving power VDD and the second driving power VSS.

The light emitting element unit 12 may emit light based on electrical signals provided from the pixel driving circuit 14. The light emitting element LD may emit light of a luminance corresponding to an electrical signal applied from the pixel driving circuit 14.

The pixel driving circuit 14 may be electrically connected to a data line Dj and a scan line Si of the pixel PXL. The data line Dj and the scan line Si may be line portions described above with reference to FIG. 1.

The driving portion described above with reference to FIG. 1 may output a data signal through the data line Dj, and output a scan signal through the scan line Si.

The data line Dj may be formed along a first line. The scan line Si may be formed along a second line that is at least non-parallel to the first line on the pixel driving circuit 14. According to an example, the data line Dj may be arranged in a longitudinal direction (or vertical direction) in a plan view of the display device 1, and the scan line Si may be arranged in a transverse direction (or horizontal direction) in the plan view of the display device 1.

As described above with reference to FIG. 1, the display device 1 may include the pixels PXL. The pixel PXL disposed on an i-th row and a j-th column may be electrically connected to an i-th scan line Si and a j-th data line Dj.

The pixel driving circuit 14 may include a first transistor T1, a second transistor T2, a storage capacitor Cst, and a first node N1.

The first transistor T1 may be a driving transistor. The first transistor T1 may have a first terminal and a second terminal. The first terminal and the second terminal of the first transistor T1 may be a source electrode and a drain electrode, respectively. As another example, the first terminal and the second terminal of the first transistor T1 may be a drain electrode and a source electrode, respectively.

The first terminal of the first transistor T1 may be electrically connected to the first driving power VDD, and the second terminal of the first transistor T1 may be electrically connected to the second driving power VSS. A gate electrode of the first transistor T1 may be electrically connected to the first node N1.

The second transistor T2 may be a switching transistor. The second transistor T2 may have a first terminal and a second terminal. The first terminal of the second transistor T2 may be electrically connected to the data line Dj, and the second terminal of the second transistor T2 may be electrically connected to the first node N1. A gate electrode of the second transistor T2 may be electrically connected to the scan line Si.

One electrode of the storage capacitor Cst may be electrically connected to the first driving power VDD, and another electrode of the storage capacitor Cst may be electrically connected to the first node N1.

The second transistor T2 may electrically connect the data line Dj with the first node N1 in case that a scan signal of a voltage, at which the second transistor T2 may be turned on, is applied from the scan line Si.

At this time, the data signal supplied from the data line Dj may be provided to the storage capacitor Cst through the first node N1 and may be charged in the storage capacitor Cst. A voltage charged in the storage capacitor Cst may be maintained until a data signal of a next frame is supplied.

The first transistor T1 may control the electrical signal provided to the light emitting element unit 12 to correspond to potential data of the first node N1.

Finally, in case that the electrical signal is supplied to the light emitting element unit 12 through the first transistor T1, the light emitting element LD included in the light emitting element unit 12 may emit light of a luminance corresponding to the electrical signal.

Referring again to FIG. 2, a structure of a pixel according to an embodiment of the specification will be described.

The pixel circuit unit PCL may include a buffer film BFL, a transistor T, a gate insulating film GI, a first interlayer insulating film ILD1, a second interlayer insulating film ILD2, a protective film PSV, a first conductive line CL1, a second conductive line CL2, a driving voltage line DVL, a first contact hole CH1, and a second contact hole CH2.

The transistor T may include a semiconductor pattern SCL, a source electrode SE, a drain electrode DE, and a gate electrode GE. The transistor T may be the first transistor T1 described with reference to FIG. 4.

The buffer film BFL may be disposed on the substrate SUB. The buffer layer BFL may protect the transistor T of the pixel circuit unit PCL from an impurity.

The gate insulating film GI may be disposed on the buffer film BFL.

The semiconductor pattern SCL may be disposed on the buffer film BFL.

The semiconductor pattern SCL may be a semiconductor layer. According to an example, the semiconductor pattern SCL may include at least one of polysilicon, amorphous silicon, and oxide semiconductor.

The semiconductor pattern SCL may include a first contact region electrically contacting the source electrode SE and a second contact region electrically contacting the drain electrode DE.

The first contact region and the second contact region may be semiconductor patterns doped with an impurity. A region between the first contact region and the second contact region may be a channel region. The channel region may be an intrinsic semiconductor pattern in which an impurity is not doped.

The gate insulating film GI may be provided on the semiconductor pattern SCL. The gate insulating film GI may include an inorganic material. According to an example, the gate insulating film GI may include at least one of silicon nitride ($SiN_x$), silicon oxide ($SiO_x$), silicon oxynitride (SiON), and aluminum oxide ($AlO_x$). According to an embodiment, the gate insulating film GI may include an organic material.

The gate electrode GE may be disposed on the gate insulating film GI.

A position of the gate electrode GE may correspond to a position of the channel region of the semiconductor pattern SCL. For example, the gate electrode GE may be disposed on the channel region of the semiconductor pattern SCL with the gate insulating film GI interposed therebetween.

The first interlayer insulating film ILD1 may be disposed on the gate electrode GE. Similarly to the gate insulating film GI, the first interlayer insulating film ILD1 may include at least one of silicon nitride ($SiN_x$), silicon oxide ($SiO_x$), silicon oxynitride (SiON), and aluminum oxide ($AlO_x$).

The source electrode SE and the drain electrode DE may be disposed on the first interlayer insulating film ILD1. The source electrode SE may pass through the gate insulating film GI and the first interlayer insulating film ILD1 to electrically contact the first contact region of the semiconductor pattern SCL, and the drain electrode DE may pass through the gate insulating film GI and the first interlayer insulating film ILD1 to electrically contact the second contact region of the semiconductor pattern SCL.

The second interlayer insulating film ILD2 may be disposed on the source electrode SE and the drain electrode DE. The second interlayer insulating film ILD2 may include an inorganic material, similarly to the first interlayer insulating film ILD1 and the gate insulating film GI. The inorganic material may include at least one configuration material of the first interlayer insulating film ILD1 and the gate insulating film GI, for example, silicon nitride (SiN$_x$), silicon oxide (SiO$_x$), silicon oxynitride (SiON), and aluminum oxide (AlO$_x$). According to an embodiment, the second interlayer insulating film ILD2 may include an organic material.

The first conductive line CL1 may be disposed on the second interlayer insulating film ILD2 and may be electrically connected to the source electrode SE through a contact hole passing through the second interlayer insulating film ILD2.

The second conductive line CL2 may be disposed on the second interlayer insulating film ILD2 and may be electrically connected to the drain electrode DE through a contact hole passing through the second interlayer insulating film ILD2.

The driving voltage line DVL may be disposed on the second interlayer insulating film ILD2. The driving voltage line DVL and the first and second conductive lines CL1 and CL2 may be formed on the same layer. The driving voltage line DVL may be the second power line PL2 described above with reference to FIG. 4.

The first conductive line CL1, the second conductive line CL2, and the driving voltage line DVL may be a path through which an electrical signal may flow. The second conductive line CL2 may be a bridge electrode electrically connecting the drain electrode DE of the transistor T and some configurations of the display element unit DPL. According to an example, the first conductive line CL1, the second conductive line CL2, and the driving voltage line DVL may include at least one of molybdenum (Mo), tungsten (W), aluminum-neodymium (AlNd), titanium (Ti), aluminum (Al), and silver (Ag).

The protective layer PSV may be provided on the first conductive line CL1, the second conductive line CL2, and the driving voltage line DVL.

The protective layer PSV may be provided in a form of an organic insulating film, an inorganic insulating film, or the organic insulating film disposed on the inorganic insulating film.

The protective layer PSV may include a first contact hole CH1 exposing a region of the second conductive line CL2 and a second contact hole CH2 exposing a region of the driving voltage line DVL.

The first contact hole CH1 may be a path through which an electrical signal provided from the transistor T is transferred. The second contact hole CH2 may be a path through which power is applied from the driving voltage line DVL.

The display element unit DPL may include a first connection line CNL1, a first electrode EL1, a second connection line CNL2, a second electrode EL2, a first insulating film INS1, a bank BNK, a light emitting element LD, a second insulating film INS2, a first contact electrode CNE1, a second contact electrode CNE2, a first encapsulation layer ENC1, and a second encapsulation layer ENC2.

The first insulating film INS1 may be disposed on the protective layer PSV. The first insulating film INS1 may include at least one of silicon nitride (SiN$_x$), silicon oxide (SiO$_x$), silicon oxynitride (SiON), and aluminum oxide (AlO$_x$), similarly to the second interlayer insulating film ILD2.

The light emitting element LD may be disposed on the first insulating film INS1. According to an example, the first insulating film INS1 may have a predetermined groove, at least a portion of the light emitting element LD may be in electrically contact with an end formed from the groove, and another portion of the light emitting element LD may be in electrically contact with another end formed from the groove.

At least a portion of the first insulating film INS1 may be disposed on the first contact electrode CNE1, the second contact electrode CNE2, the first electrode EL1, and/or the second electrode EL2, stabilizing an electrical connection and attenuating an external influence.

The first connection line CNL1 may be arranged on the protective layer PSV.

The first connection line CNL1 may be electrically connected to the first electrode EL1.

The second connection line CNL2 may be arranged on the protective layer PSV. The second connection line CNL2 and the first connection line CNL1 may be formed on the same layer.

The second connection line CNL2 may be electrically connected to the second electrode EL2.

The first connection line CNL1 may be partially removed so that a corresponding pixel PXL is driven individually (or independently) from another pixel PXL adjacent to the corresponding pixel PXL. The second connection line CNL2 may be commonly provided to the corresponding pixel PXL and other pixels PXL adjacent thereto. For example, the second connection line CNL2 of the corresponding pixel PXL may be electrically connected to the second connection line CNL2 of each of the adjacent pixels PXL.

The first electrode EL1 may be arranged on the protective layer PSV. The first electrode EL1 and the first connection line CNL1 may be formed on the same layer. In particular, according to an example, the first electrode EL1 and the first connection line CNL1 may be formed in the same configuration. The first electrode EL1 may be arranged parallel to a main surface of the protective layer PSV.

As described above with reference to FIG. 4, the first electrode EU may be a path through which a voltage of the first driving power VDD may be applied and may be a path through which an electrical signal provided from the pixel driving circuit 14 is provided.

The second electrode EL2 may be arranged on the protective layer PSV. The second electrode EL2 and the second connection line CNL2 may be formed on the same layer. In particular, according to an example, the second electrode EL2 and the second connection line CNL2 may be formed in the same configuration. The second electrode EL2 may be arranged parallel to the main surface of the protective layer PSV.

As described above with reference to FIG. 4, the second electrode EL2 may be a path through which a voltage may be applied from the second driving power VSS.

The first electrode EL1 and the second electrode EL2 may reflect light emitted from the light emitting element LD in a display direction of the display device 1 so that light emission efficiency of the light emitting element LD is improved.

The light emitting element LD may be disposed on the first insulating film INS1 between the first electrode EL1 and the second electrode EL2. The light emitting element LD may have a nanoscale or microscale size.

The light emitting element LD may function as a light source of the pixel PXL including the light emitting element LD. For example, the light emitting element LD may output predetermined light based on an electrical signal related to light emission applied from the transistor T as described above with reference to FIG. 4.

A detailed structure of the light emitting element LD will be described with reference to FIG. 5.

Figure 5:
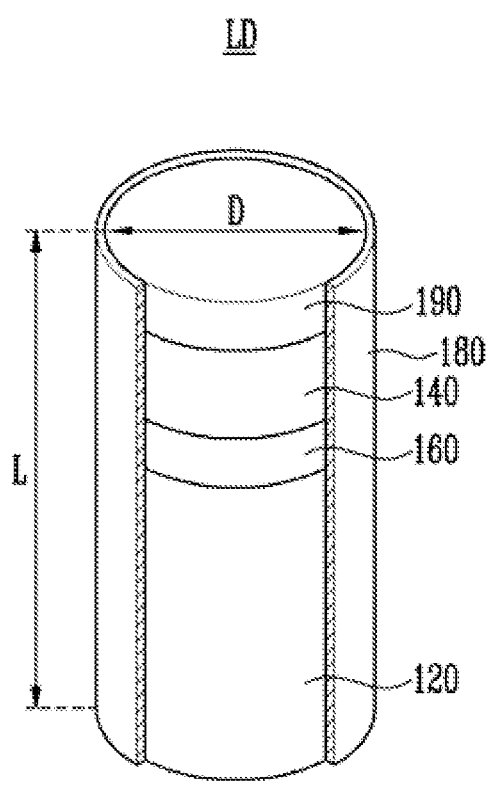
FIG. 5 is a schematic perspective view illustrating a light emitting element included in a pixel according to an embodiment of the specification.

FIG. 5 is a schematic perspective view illustrating a light emitting element included in a pixel according to an embodiment of the specification.

Referring to FIG. 5, the light emitting element LD may include a first semiconductor layer 120, a second semiconductor layer 140, an active layer 160, an insulating film 180, and an additional electrode 190.

The light emitting element LD may have a shape extending in the longitudinal direction. For example, a height L of the light emitting element LD may be greater than a diameter D of the light emitting element LD. For example, the light emitting element LD may have a cylindrical shape, a rod shape, or a bar shape but is not limited to a specific shape.

The first semiconductor layer 120 may include a semiconductor layer having a predetermined type. For example, the first semiconductor layer 120 may include an N-type semiconductor layer doped with a predetermined dopant.

The second semiconductor layer 140 may include a semiconductor layer of a type different from that of the first semiconductor layer 120. For example, in case that the first semiconductor layer 120 includes an N-type semiconductor layer, the second semiconductor layer 140 may include a P-type semiconductor layer doped with a dopant different from the predetermined dopant.

The first semiconductor layer 120 and the second semiconductor layer 140 may include at least one semiconductor material among InAlGaN, GaN, AlGaN, InGaN, AlN, and InN.

The first semiconductor layer 120 and the second semiconductor layer 140 may have heights different from each other in the longitudinal direction of the light emitting element LD. According to an example, referring to FIG. 5, the height of the first semiconductor layer 120 may be greater than the height of the second semiconductor layer 140.

The active layer 160 may be disposed between the first semiconductor layer 120 and the second semiconductor layer 140. The active layer 160 may have a single or multiple quantum well structure.

In case that an electric field of a voltage equal to or greater than a predetermined voltage is applied to both ends of the light emitting element LD, an electron-hole pair may be combined in the active layer 160, and light may be emitted. Using such a principle, the light emitting element LD including the active layer 160 may be included in the pixel PXL and may be employed in various display devices.

The additional electrode 190 may be disposed on the first semiconductor layer 120 or the second semiconductor layer 140. The additional electrode 190 may be an ohmic contact electrode or a Schottky contact electrode.

The additional electrode 190 may include at least one of chromium (Cr), titanium (Ti), aluminum (Al), gold (Au), nickel (Ni), indium tin oxide (ITO), and oxide thereof, but is not limited thereto.

The insulating film 180 may cover at least a portion of an outer surface of the light emitting element LD. The insulating film 180 may prevent an electrical short circuit and contamination that may occur in case that the active layer 160 contacts a material (especially other conductive materials) other than the first semiconductor layer 120 and the second semiconductor layer 140.

The insulating film 180 may include a transparent insulating material. According to an example, the insulating film 180 may include at least one of silicon oxide ($SiO_x$), silicon nitride ($SiN_x$), silicon oxynitride (SiON), aluminum oxide ($AlO_x$), and titanium dioxide ($TiO_2$).

Referring to FIG. 2 again, the second insulating film INS2 may be disposed on the light emitting element LD. The second insulating film INS2 may be formed to cover at least a region corresponding to the active layer 160 of the light emitting element LD.

However, according to an embodiment, at least a portion of the second insulating film INS2 may be disposed on a rear surface of the light emitting element LD. The second insulating film INS2 formed on the rear surface of the light emitting element LD may fill an empty gap between the first insulating film INS1 and the light emitting element LD in a process of forming the second insulating film INS2 on the light emitting element LD.

When viewed from above, a cross-sectional area of the second insulating film INS2 may reduce as the cross-sectional area of the second insulating film INS2 is farther spaced apart from the light emitting element LD. In this case, the cross section of the second insulating film INS2 may have a trapezoidal shape in a cross-sectional view. However, the shape of the second insulating film INS2 is not limited to the above-described example and may be provided in any of various shapes.

The second insulating film INS2 may include at least one of an organic material and an inorganic material. In case that the second insulating film INS2 includes the organic material, the second insulating film INS2 may be an organic insulating film.

The first contact electrode CNE1 and the second contact electrode CNE2 may be disposed on the first insulating film INS1.

Referring to FIG. 2, when viewed in a first direction (the first direction described below may refer to a direction facing the pixel shown in FIG. 2), each of the first contact electrode CNE1 and the second contact electrode CNE2 may be disposed on a side surface of the light emitting element LD. The first contact electrode CNE1 may directly contact an exposed surface of one of both ends of the light emitting element LD, and the second contact electrode CNE2 may directly contact an exposed surface of the other end of both ends of the light emitting element LD.

The first contact electrode CNE1 and the second contact electrode CNE2 may have a predetermined height in an upward direction with respect to the main surface of the light emitting element LD. The first contact electrode CNE1 may be electrically connected to the first electrode EL1 through a contact hole passing through the first insulating film INS1, and the second contact electrode CNE2 may be electrically connected to the second electrode EL2 through a contact hole passing through the first insulating film INS1.

Each of the first contact electrode CNE1 and the second contact electrode CNE2 may be electrically connected to the light emitting element LD. According to an example, the first contact electrode CNE1 and the second contact electrode CNE2 may be at least any one of conductive materials including indium tin oxide (ITO), indium zinc oxide (IZO), and indium-tin-zinc-oxide (ITZO).

According to a specific embodiment, the first contact electrode CNE1 and the second contact electrode CNE2 may include the same material. The first contact electrode CNE1 and the second contact electrode CNE2 may have the same composition.

An electrical signal applied through the first electrode EU may be provided to the light emitting element LD through the first contact electrode CNE1. The applied electrical signal may be provided from the transistor T through the first contact hole CH1.

As described above with reference to FIG. 4, the light emitting element LD may emit light based on electric signals on the light emission applied through the transistor T.

An electrical signal applied through the second electrode EL2 may be provided to the light emitting element LD through the second contact electrode CNE2.

The bank BNK may be disposed on the first insulating film INS1. The bank BNK may define an emission area of the pixel PXL. Specifically, the pixel PXL may include the bank BNK provided in a non-emission area surrounding the periphery of the emission area. For example, the bank BNK may be a pixel definition film.

The bank BNK may include at least any one of an organic material or an inorganic material.

The first encapsulation layer ENC1 may be disposed on the first insulating film INS1 corresponding to a position of the first contact electrode CNE1 and the second contact electrode CNE2.

The first encapsulation layer ENC1 may include a photosensitive material. For example, the first encapsulation layer ENC1 may be a photoresist applied in a photolithography process for the first contact electrode CNE1 and the second contact electrode CNE2.

The first encapsulation layer ENC1 may include a first encapsulation region 106 and a second encapsulation region 108. A thickness of the first encapsulation region 106 may be less than a thickness of the second encapsulation region 108. Contents of the first encapsulation region 106 and the second encapsulation region 108 will be described below with reference to FIG. 11.

The second encapsulation layer ENC2 may be disposed on the first encapsulation layer ENC1. The second encapsulation layer ENC2 may include at least any one of an inorganic material and an organic material. However, the second encapsulation layer ENC2 may not be included in the pixel PXL as necessary.

The first encapsulation layer ENC1 and/or the second encapsulation layer ENC2 may protect the display element unit DPL from an external influence.

Figure 3:
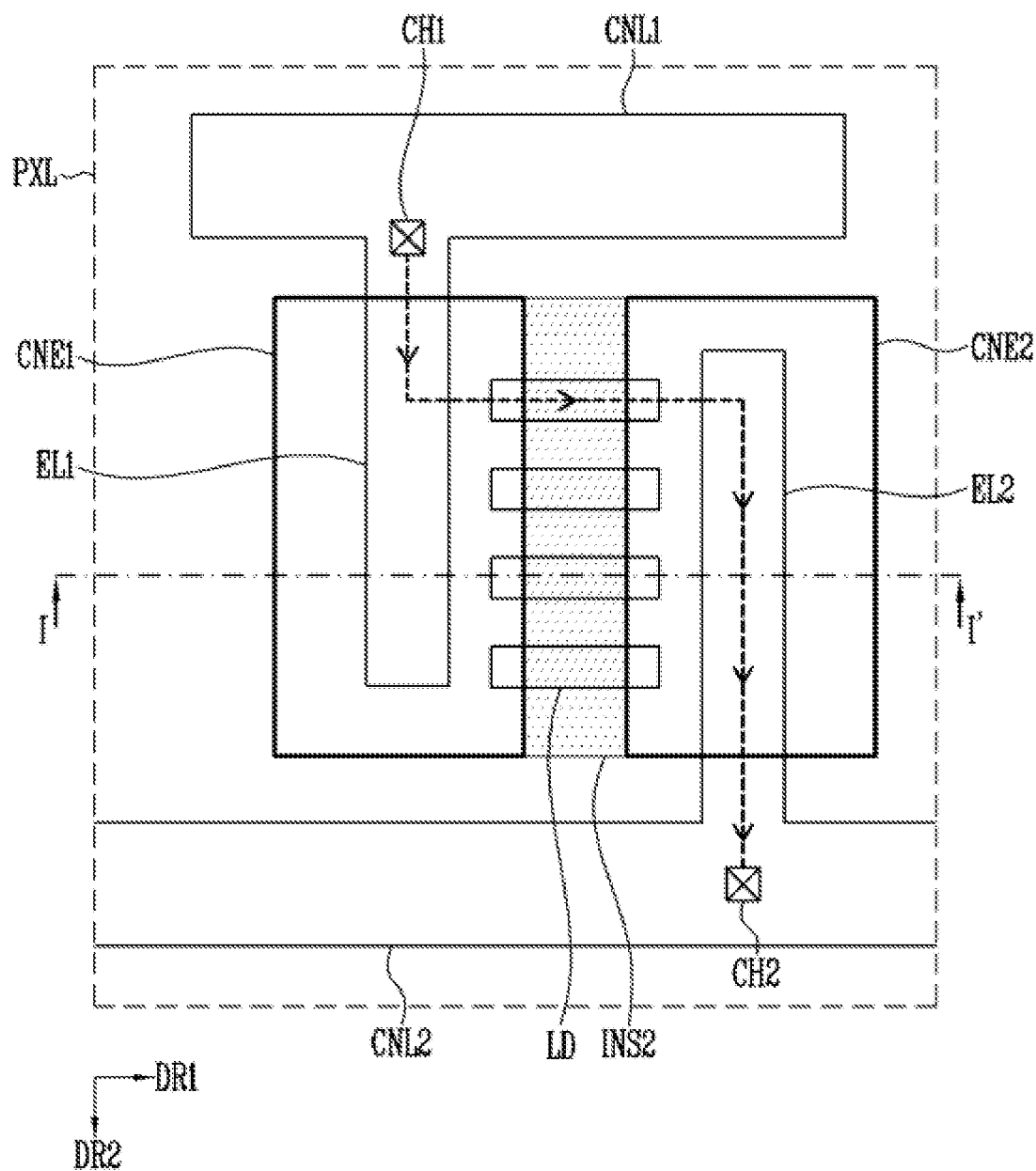
FIG. 3 is a schematic plan view illustrating an upper surface of a pixel according to an embodiment of the specification.

FIG. 3 is a schematic plan view illustrating an upper surface of a pixel according to an embodiment of the specification.

Referring to FIG. 3, the pixel PXL may include light emitting elements LD arranged in a parallel structure for an alignment electrode. For example, the first electrode EL1 and the second electrode EL2 may function as an alignment electrode for the light emitting element LD.

The light emitting element LD included in the pixel PXL may be electrically connected to the first contact electrode CNE1 electrically connected to the first electrode EL1 and to the second contact electrode CNE2 electrically connected to the second electrode EL2. As described above, the first electrode EL1 may receive a predetermined electrical signal through the first contact hole CH1. The second electrode EL2 may receive a predetermined electrical signal through the second contact hole CH2.

The second connection line CNL2 may provide a path electrically connected to at least a portion of an adjacent pixel PXL.

At least a portion of the second insulating film INS2 may be disposed on the light emitting element LD. The first contact electrode CNE1 and the second contact electrode CNE2 may not be disposed on an upper surface of the second insulating film INS2. For example, in a plan view, the first contact electrode CNE1 and the second contact electrode CNE2 may not overlap the second insulating film INS2.

However, a disposition relationship for the light emitting element LD, the electrode, and the like is not limited to the example described above with reference to FIG. 3, and a disposition relationship according to various modifiable embodiments may be implemented.

Hereinafter, a method of manufacturing a pixel according to an embodiment of the specification will be described below with reference to FIGS. 6 to 11, 12A and 12B. However, a technical feature related to the method of manufacturing the pixel may be interpreted with reference to the contents described above, and repetitive contents may be omitted.

Figure 6:
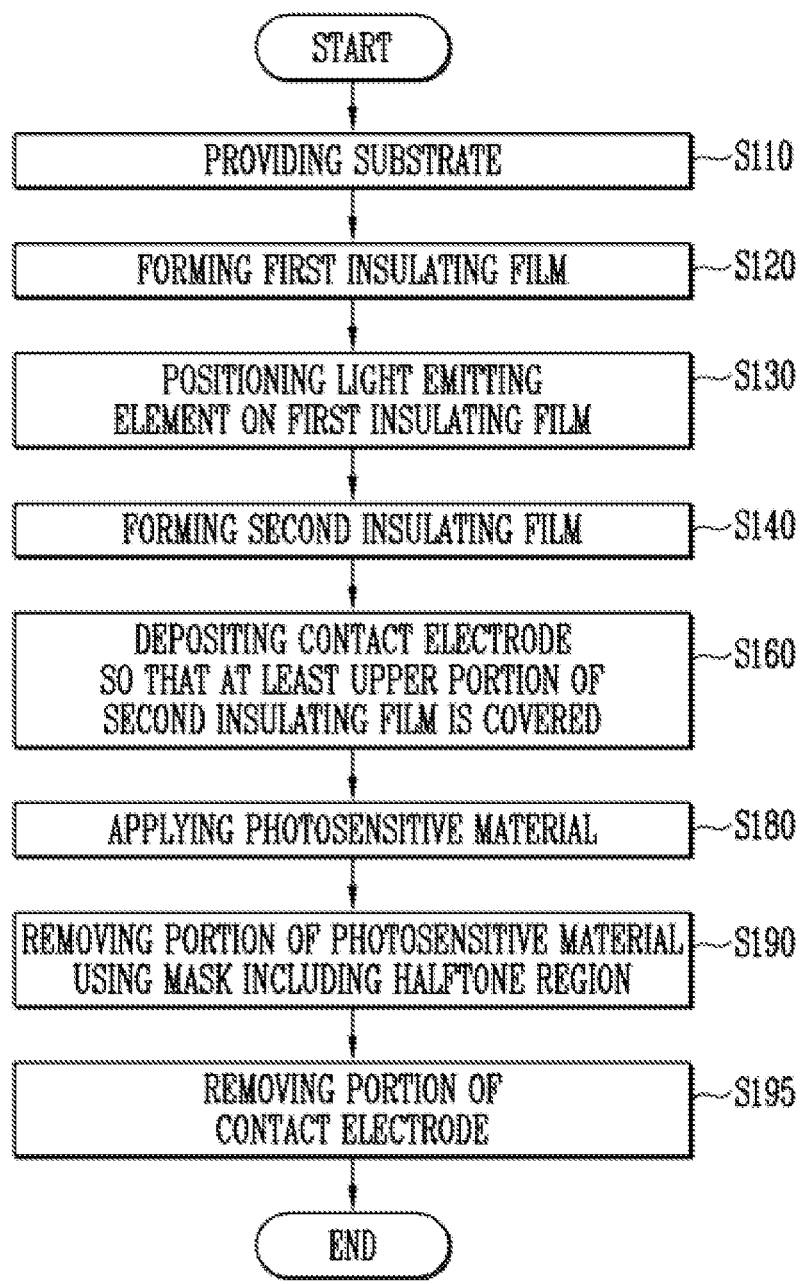
FIG. 6 is a flowchart illustrating a method of manufacturing a pixel according to an embodiment of the specification.
Figure 7:
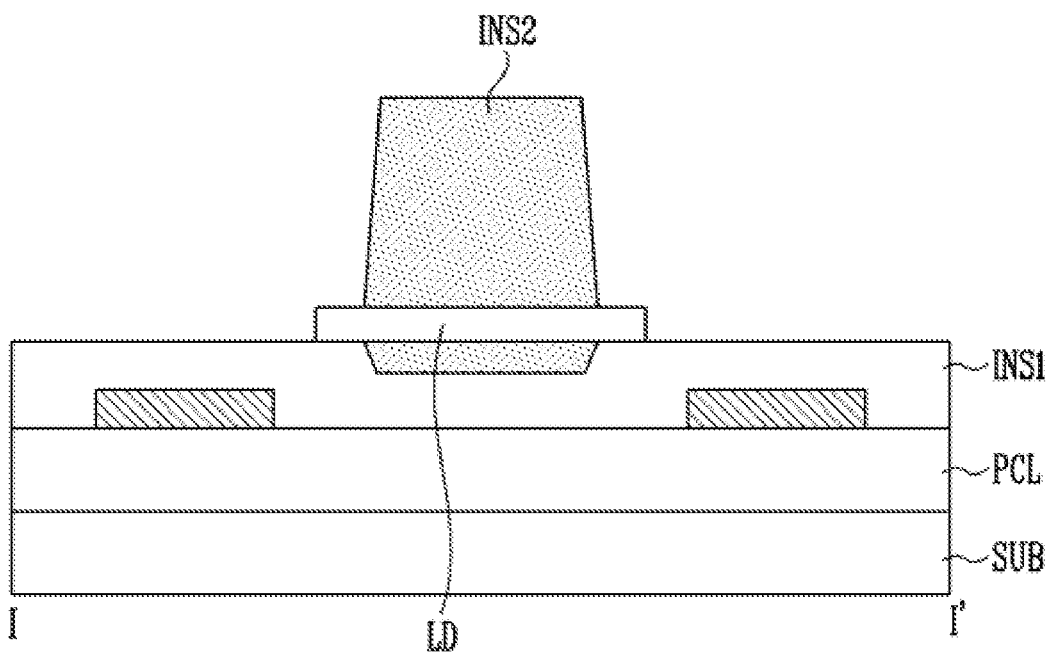
FIGS. 7 to 11 are schematic cross-sectional views of a pixel according to an embodiment of the specification, respectively showing specific time points while the method of manufacturing the pixel is performed.

FIG. 6 is a flowchart illustrating a method of manufacturing a pixel according to an embodiment of the specification.

FIGS. 7 to 11 are schematic cross-sectional views of a pixel according to an embodiment of the specification, views respectively showing specific time points while the method of manufacturing the pixel is performed.

Figure 12A:
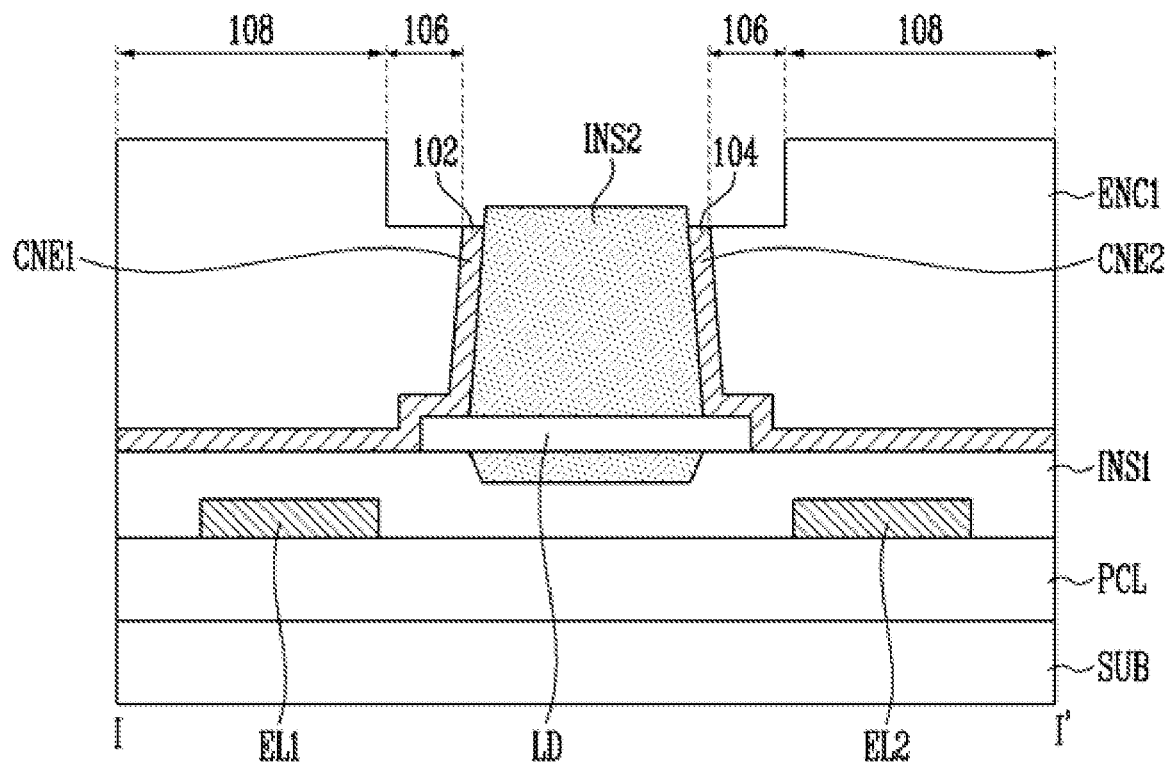
FIGS. 12A and 12B are schematic cross-sectional views of a pixel according to an embodiment of the specification, showing a pixel, in which some structures are modified.
Figure 12B:
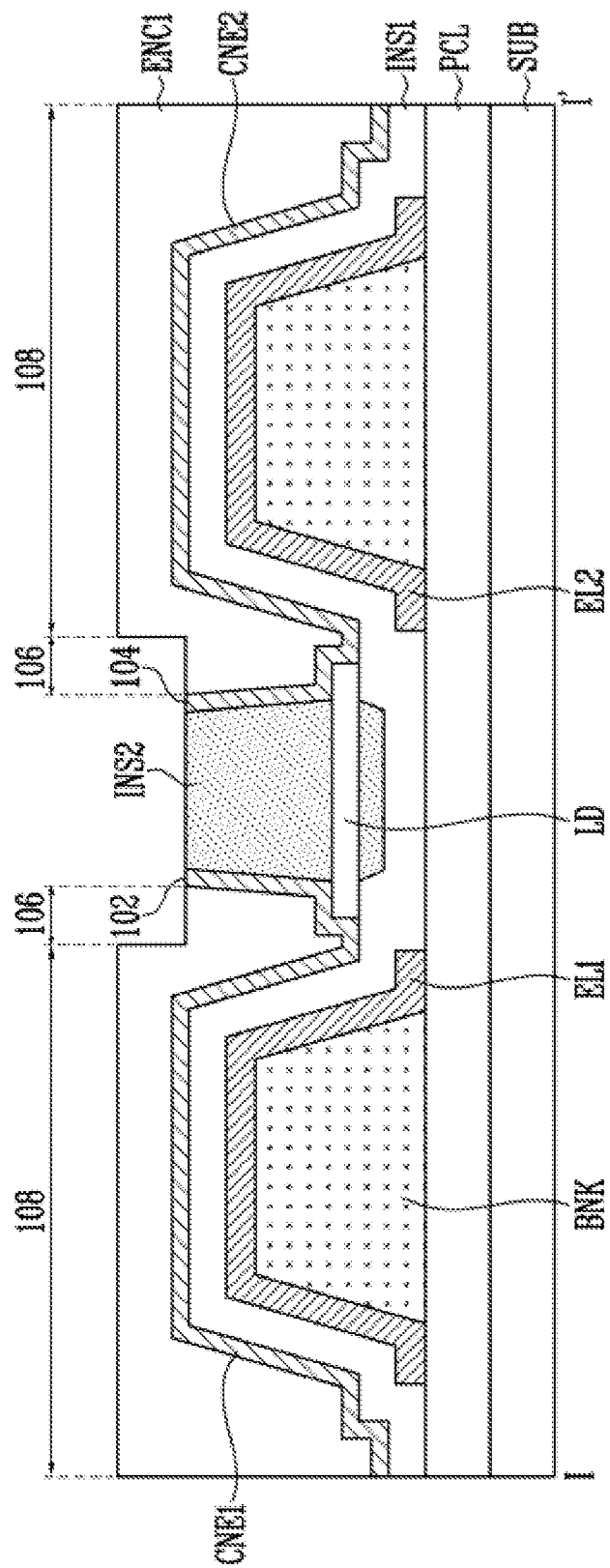

FIGS. 12A and 12B are schematic cross-sectional views of a pixel according to an embodiment of the specification, showing a pixel, in which some structures are modified.

Specifically, the views of the pixel according to an embodiment of the specification shown in FIGS. 7 to 11, 12A, and 12B are schematic cross-sectional views along line I-I' of FIG. 3.

The method of manufacturing the pixel according to an embodiment of the specification may include providing a substrate (S110), forming a first insulating film (S120), positioning a light emitting element on the first insulating film (S130), forming a second insulating film (S140), depositing a contact electrode so that at least upper portion of the second insulating film is covered (S160), applying a photosensitive material (S180), removing a portion of the photosensitive material using a mask including a halftone region (S190), and removing a portion of the contact electrode (S195).

In the providing of the substrate (S110), a predetermined substrate may be provided. The substrate may refer to the substrate SUB described above with reference to FIG. 2. In the providing of the substrate (S110), the pixel circuit unit PCL may be formed on the predetermined substrate SUB.

Although not shown in the drawing, after the providing of the substrate (S110), forming the first electrode EU and the second electrode EL2 may be performed.

In the forming of the first insulating film (S120), the first insulating film INS1 may be formed on the substrate SUB on which the pixel circuit unit PCL is formed. The first insulating film INS1 formed on a layer, on which the first electrode EL1 or the second electrode EL2 is not arranged, is formed at a height different from that of the first insulating film INS1 formed on an electrode arranged, on which the first electrode EL1 or the second electrode EL2 is arranged, and thus the first insulating film INS1 may have a height difference.

In the positioning of the light emitting element (S130), the light emitting element LD may be disposed on the first insulating film INS1.

Before the positioning of the light emitting element (S130), arranging a predetermined bank (refer to "BNK" of FIG. 2) may be performed to facilitate an arrangement of the light emitting element LD. Referring to FIG. 12B, the bank BNK may be formed on the pixel circuit unit PCL, and the first electrode EL1 and/or the second electrode EL2 may be formed on the bank BNK. The first electrode EL1 and/or the second electrode EL2 formed on the bank BNK may guide the light emitted from the light emitting element LD in a predetermined direction to increase the light emission efficiency of the light emitting element LD. However, the present step may be omitted if desired.

In the forming of the second insulating film (S140), the second insulating film INS2 may be arranged on the light emitting element LD. The second insulating film INS2 may be disposed on the light emitting element LD so that a first end of the light emitting element LD and a second end opposite to the first end are open (refer to FIG. 7).

Figure 8:
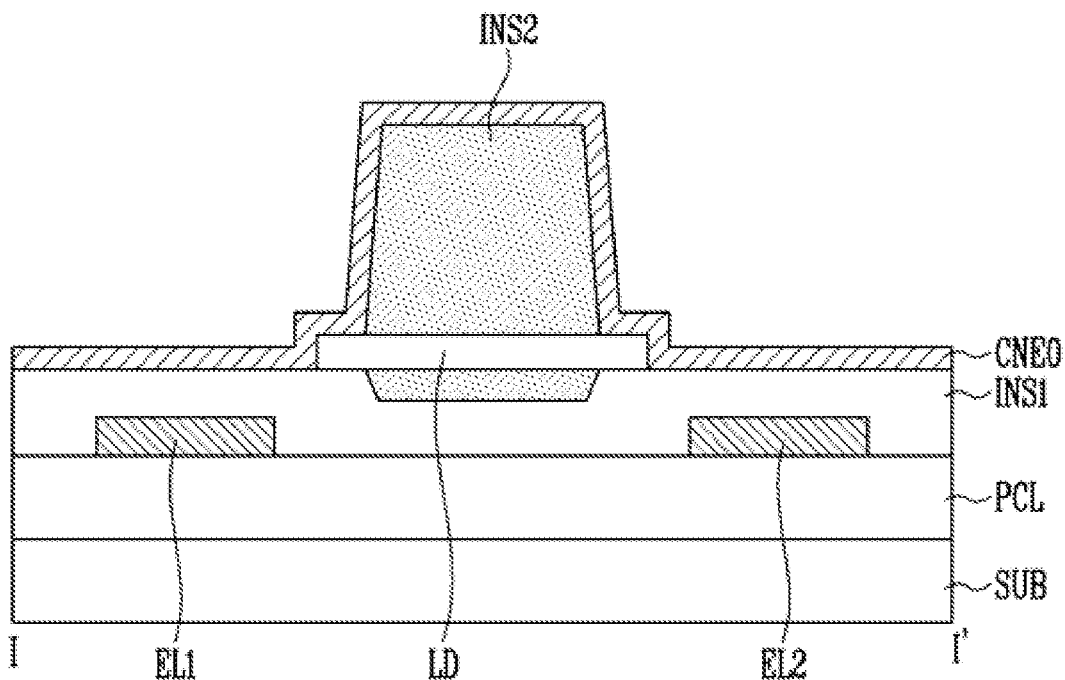
Figure 9:
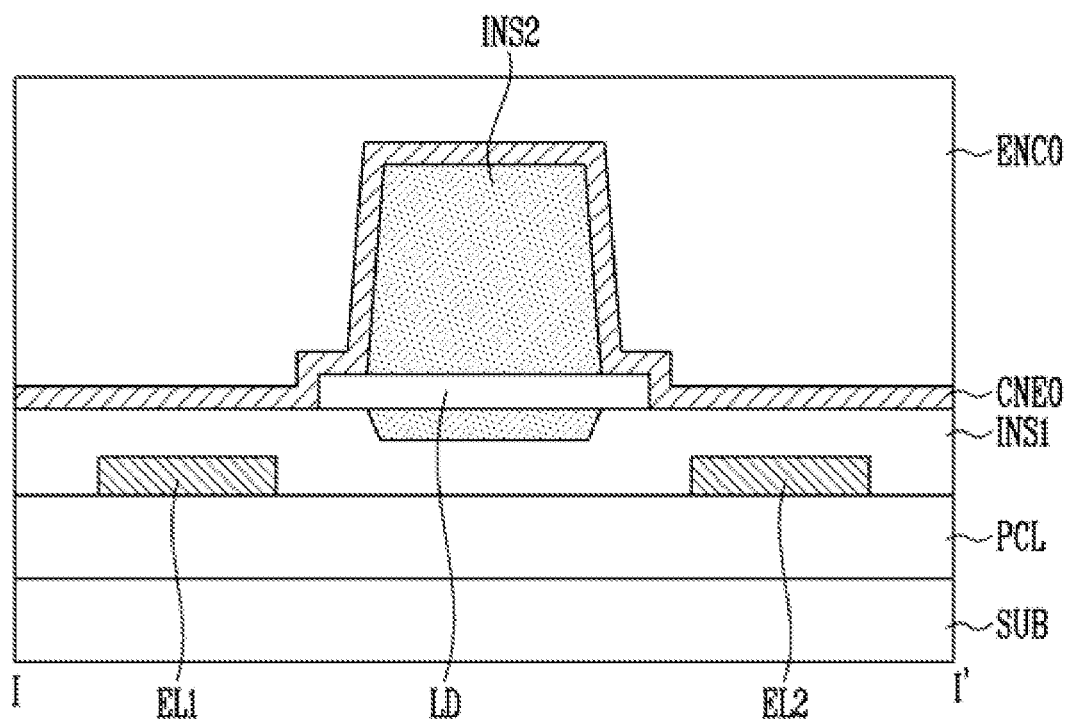
Figure 10:
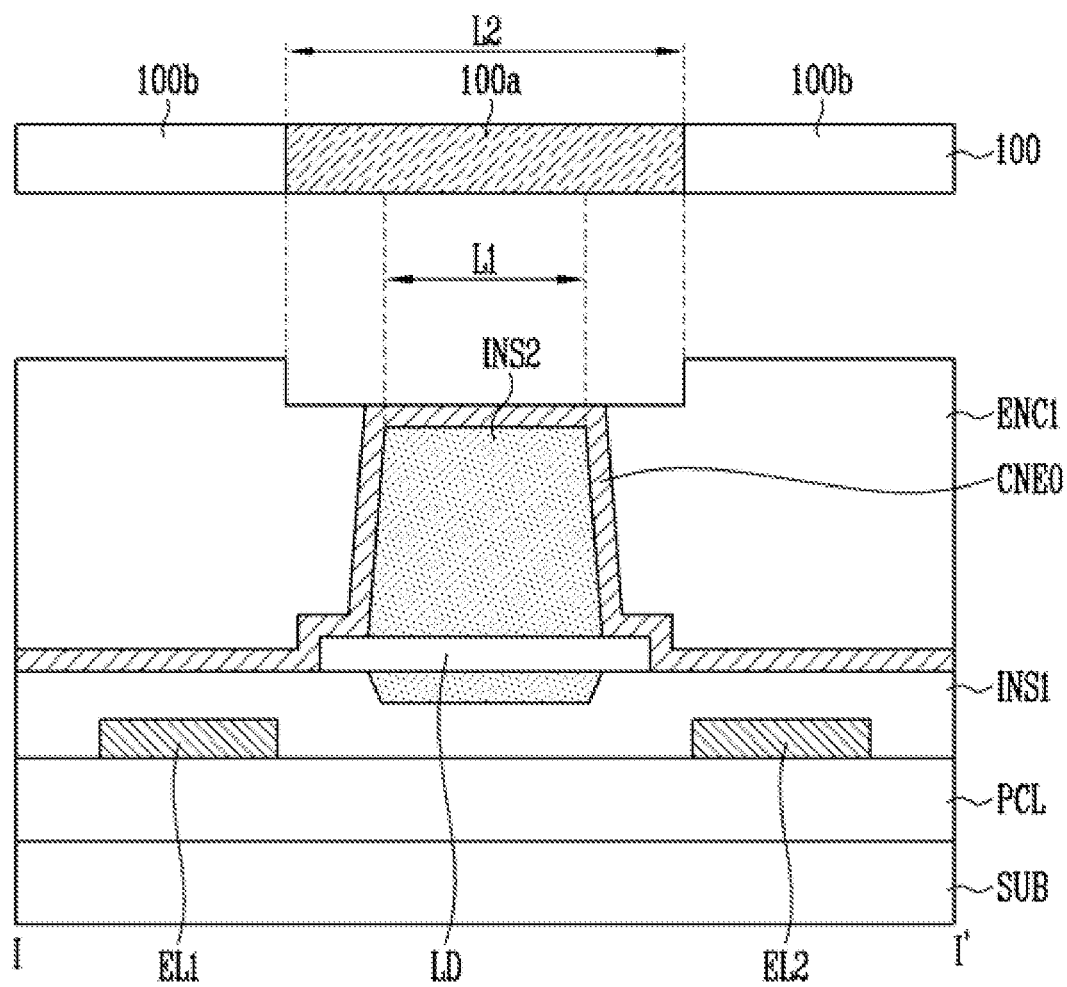

In the depositing of the contact electrode (S160), a predetermined contact electrode CNE0 may be deposited on a material obtained in the forming of the second insulating film (S140), for example, the first insulating film INS1 including the second insulating film INS2. Referring to FIG. 8, the predetermined contact electrode CNE0 may be disposed on the first insulating film INS1 and may also be disposed on a portion of the light emitting element LD and a portion of the second insulating film INS2 that are open to the outside.

In the applying of the photosensitive material (S180), an encapsulation layer ENC0 may be applied on a material obtained through the depositing of the contact electrode (S160), for example, the predetermined contact electrode CNE0. The encapsulation layer ENC0 may include at least a photosensitive material, as described above with reference to the first encapsulation layer ENC1 of FIG. 2.

In the removing of the portion of the photosensitive material (S190), the first encapsulation layer ENC1 may be formed by performing an exposure and development process on at least a portion of a region where the photosensitive material is applied. In the exposure and development process performed in the present step, a halftone mask 100 may be used.

The halftone mask 100 may include a halftone region 100a and a full-tone region 100b. The halftone mask 100 may have a first transmittance in the halftone region 100a and a second transmittance, which is less than the first transmittance, in the full-tone region 100b.

The halftone region 100a of the halftone mask 100 may correspond to an upper surface of the second insulating film INS2. A length L2 of the halftone region 100a based on a main surface of the substrate SUB may be at least equal to or greater than a length L1 of an upper surface of the second insulating film INS2.

The length L2 of the halftone region 100a may be greater than a sum of the length L1 of the upper surface of the second insulating film INS2, a thickness of the predetermined contact electrode CEN0 disposed on a side surface of the second insulating film INS2, and a thickness of the predetermined contact electrode CNE0 on another side surface of the second insulating film INS2.

In the removing of the portion of the photosensitive material (S190), the encapsulation layer ENC0 corresponding to the halftone region 100a of the halftone mask 100 may be removed, and the first encapsulation layer ENC1 described above with reference to FIG. 2 may be formed. In the present step, a portion of the encapsulation layer ENC0 may be removed, and the predetermined contact electrode CNE0 disposed thereunder may be exposed to the outside.

In the removing of the portion of the contact electrode (S195), the predetermined contact electrode CNE0 exposed to the outside may be removed by performing an etching process using the first encapsulation layer ENC1 as an etching mask. As a portion of the predetermined contact electrode CNE0 is removed, at least a portion of the second insulating film INS2 may be exposed to the outside.

According to an embodiment, a portion of the second insulating film INS2 disposed under the predetermined contact electrode CNE0 may be removed as the contact electrode CNE0 exposed to the outside is removed. According to a degree at which a portion of the second insulating film INS2 disposed under the predetermined contact electrode CNE0 is removed, a height of the second insulating film INS2 may be different. The height of the second insulating film INS2 may correspond to a height of the first contact electrode CNE1 and/or a height of the second contact electrode CNE2.

The height of the second insulating film INS2 may be equal to or greater than the height of the first contact electrode CNE1 and/or the height of the second contact electrode CNE2. According to an embodiment, the height of the second insulating film INS2 may be equal to the height of the first contact electrode CNE1 and the height of the second contact electrode CNE2 (refer to FIG. 11). As another example, according to a modified embodiment, the height of the second insulating film INS2 may be greater than the height of the first contact electrode CNE1 and the height of the second contact electrode CNE2 (refer to FIG. 12A).

The predetermined contact electrode CNE0 which is removed in the present step and is exposed to the outside may be disposed on the upper surface of the second insulating film INS2.

Figure 11:
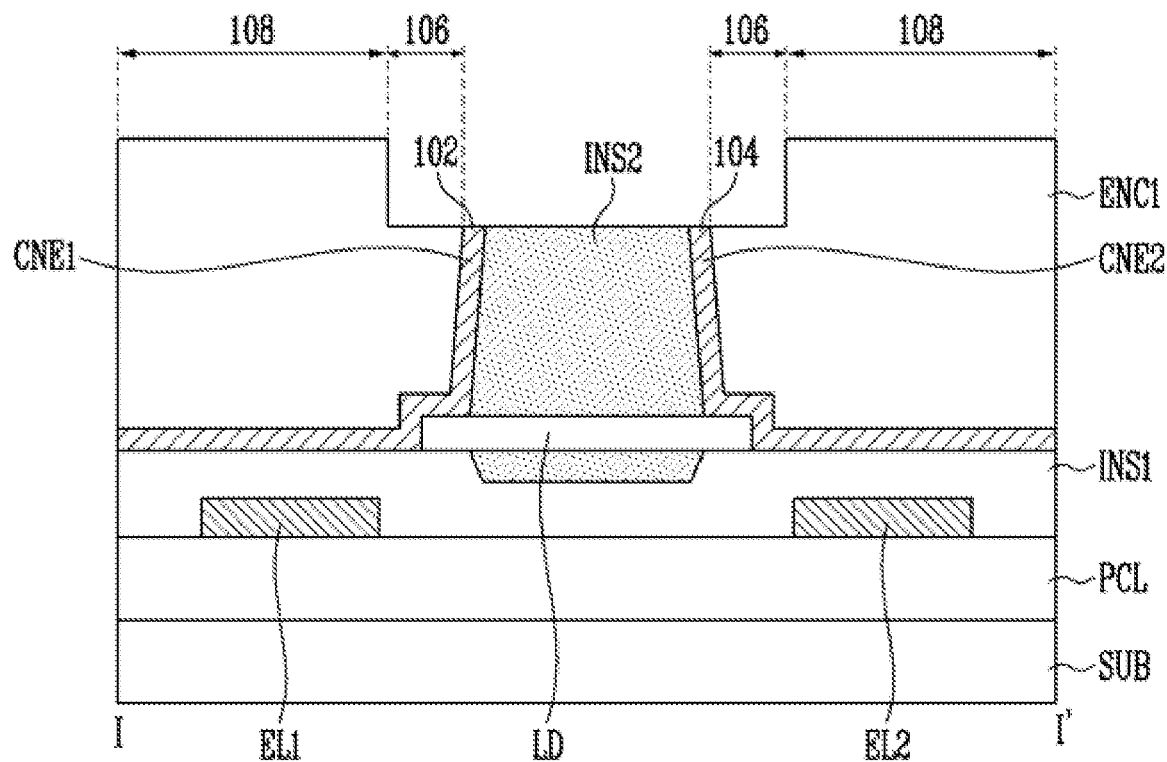

The predetermined contact electrode CNE0 from which a region is removed, as shown in FIGS. 11, 12A, and 12B, may be provided in a shape of the first contact electrode CNE1 and the second contact electrode CNE2 which are not in electrical contact with each other on the upper surface of the second insulating film INS2. The first contact electrode CNE1 may be the first contact electrode CNE1 described above with reference to FIGS. 2 and 3, and the second contact electrode CNE2 may be the second contact electrode CNE2 described above with reference to FIGS. 2 and 3.

For example, the first contact electrode CNE1 and the second contact electrode CNE2 may be formed at the same time. According to the embodiment, the first contact electrode CNE1 and the second contact electrode CNE2 may not be respectively formed at least at different time points.

As described above, since the first contact electrode CNE1 and the second contact electrode CNE2 are formed by using the first encapsulation layer ENC1, a portion of which is removed, as an etching mask, the upper surface of the second insulating layer INS2 and at least a portion of the first encapsulation layer ENC1 may be formed on the same plane or layer.

The first contact electrode CNE1 may have a first point 102 that is in physical contact with the second insulating film INS2 and is the most distant from a first surface of the light emitting element LD.

The first surface may mean an upper surface of the light emitting element LD on which the second insulating film INS2 is disposed.

The second contact electrode CNE2 may have a second point 104 that is in physical contact with the second insulating film INS2 and is the most distant from the first surface.

The shortest distance between the first point 102 and the first surface may be equal to or less than the shortest distance between the second point 104 and the first surface a predetermined difference.

Therefore, an extension line between the first point 102 and the second point 104 may be parallel to the first surface of the light emitting element LD. For example, top surfaces between the first point 102 and the second point 104 may be parallel to the first surface of the light emitting element LD.

As described above, the first contact electrode CNE1 and the second contact electrode CNE2 may not be in electrical contact with each other on the upper surface of the second insulating film INS2. Therefore, the height of the second insulating film INS2 with respect to the main surface of the light emitting element LD may be equal to the shortest distance between the first point 102 and the first surface. As another example, the height of the second insulating film INS2 with respect to the main surface of the light emitting element LD may be equal to the shortest distance between the second point 104 and the first surface.

A height at which the region corresponding to the halftone region 100a of the halftone mask 100 is etched may be uniform. With respect to the substrate SUB, a height of the first encapsulation layer ENC1 disposed in the region corresponding to the halftone region 100a may be uniform.

The first encapsulation layer ENC1 may include a first encapsulation region 106 and a second encapsulation region 108. The first encapsulation region 106 may be closer to the second insulating film INS2 than the second encapsulation region 108. The thickness of the first encapsulation layer ENC1 in the first encapsulation region 106 may be less than the thickness of the first encapsulation layer ENC1 in the second encapsulation region 108.

The first encapsulation layer ENC1 in the first encapsulation region 106 may have a height equal to a height of the first contact electrode CNE1 and a height of the second contact electrode CNE2.

An upper surface of the first encapsulation layer ENC1 in the first encapsulation region 106 and the upper surface of the second insulating film INS2 may form the same plane.

After the removing of the portion of the contact electrode (S195), the first encapsulation layer ENC1 may not be removed. The first encapsulation layer ENC1 may function as an external protective layer of a pixel according to an embodiment.

Hereinafter, a pixel and a method of manufacturing the pixel according to another embodiment of the specification will be described below with reference to FIGS. 13 to 18. However, contents that may be repetitive to the description of the above-described embodiment may be omitted, and technical contents should be interpreted with reference to the above-described embodiment and detailed description.

Figure 13:
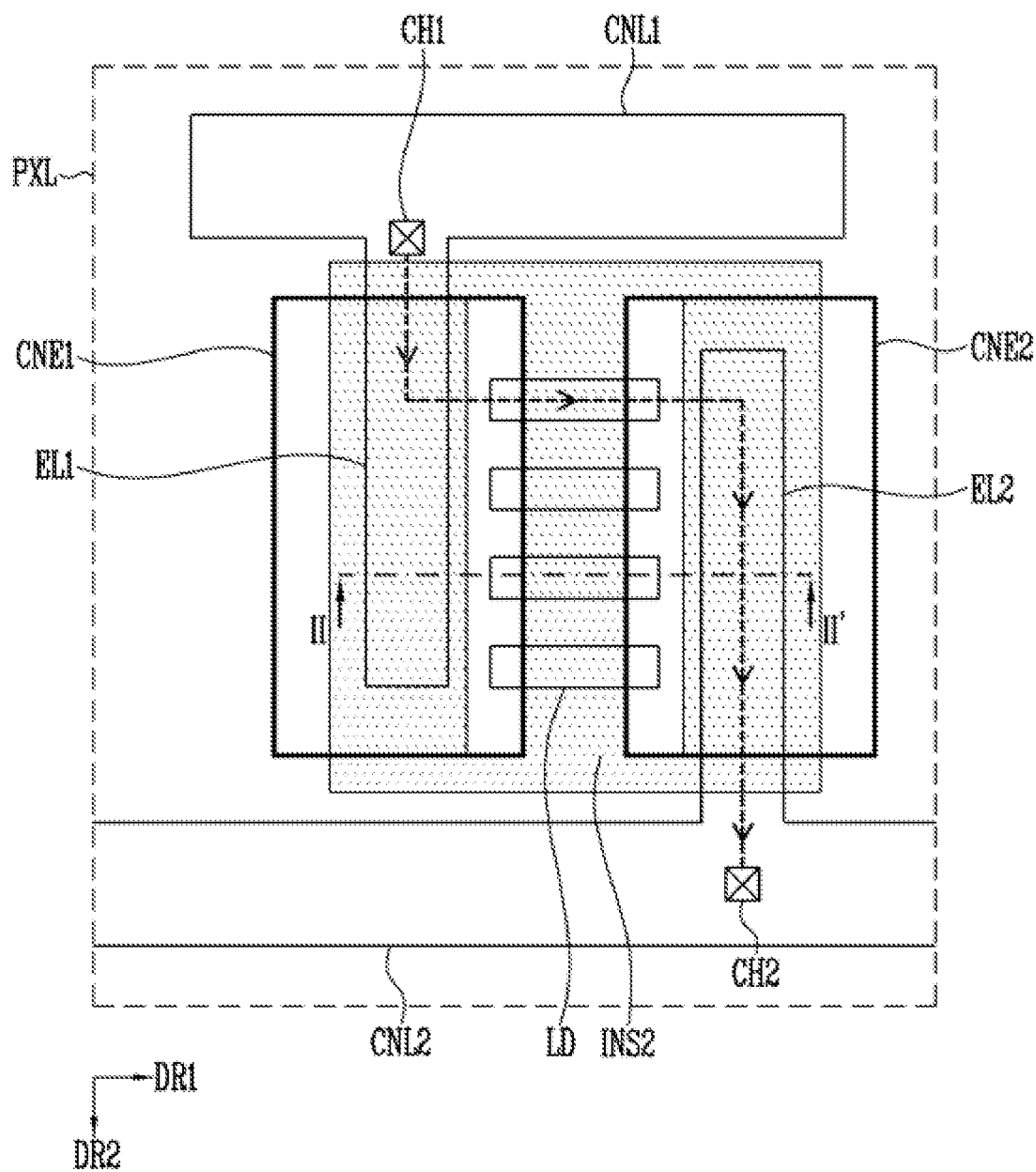
FIG. 13 is a schematic plan view illustrating an upper surface of a pixel according to still another embodiment of the specification.

FIG. 13 is a schematic plan view illustrating an upper surface of a pixel according to still another embodiment of the specification.

FIGS. 14 to 18 are schematic cross-sectional views of a pixel according to still another embodiment of the specification, respectively showing specific time points while a method of manufacturing the pixel is performed.

Specifically, the views related to the pixel according to still another embodiment of the specification shown in FIGS. 14 to 18 may be cross-sectional views taken along line II-II' of FIG. 13.

Referring to FIG. 13, the second insulating film INS2 corresponding to a position of the light emitting element LD may not overlap the first contact electrode CNE1 and the second contact electrode CNE2 in a plan view. However, the first contact electrode CNE1 and the second contact electrode CNE2 may be disposed on the second insulating film INS2 corresponding to the first electrode EL1 and the second electrode EL2.

Referring to FIGS. 14 to 18, according to the pixel PXL according to still another embodiment of the specification, the second insulating film INS2 may be positioned in a region other than the light emitting element LD. At least a portion of the second insulating film INS2 may be formed on the light emitting element LD, and at least another portion of the second insulating film INS2 may be formed on the first insulating film INS1.

In the embodiment, a region of the second insulating film INS2 may partially overlap each of the first and second contact electrodes CNE1 and CNE2 in a plan view. A region of the second insulating film INS2 may or may not partially overlap the first and second electrodes EL1 and EL2 in a plan view.

The second insulating film INS2 disposed on the light emitting elements LD and the second insulating film INS2 disposed on the first insulating film INS1 may be integral with each other and may be connected to each other. In a plan view, the second insulating film INS2 disposed on the light emitting elements LD may extend in a direction intersecting the alignment direction of the light emitting elements LD. In a plan view, the second insulating film INS2 disposed on the first insulating film INS1 may be provided in a shape surrounding (or enclosing) the light emitting elements LD disposed between the first electrode EL1 and the second electrode EL2.

Figure 14:
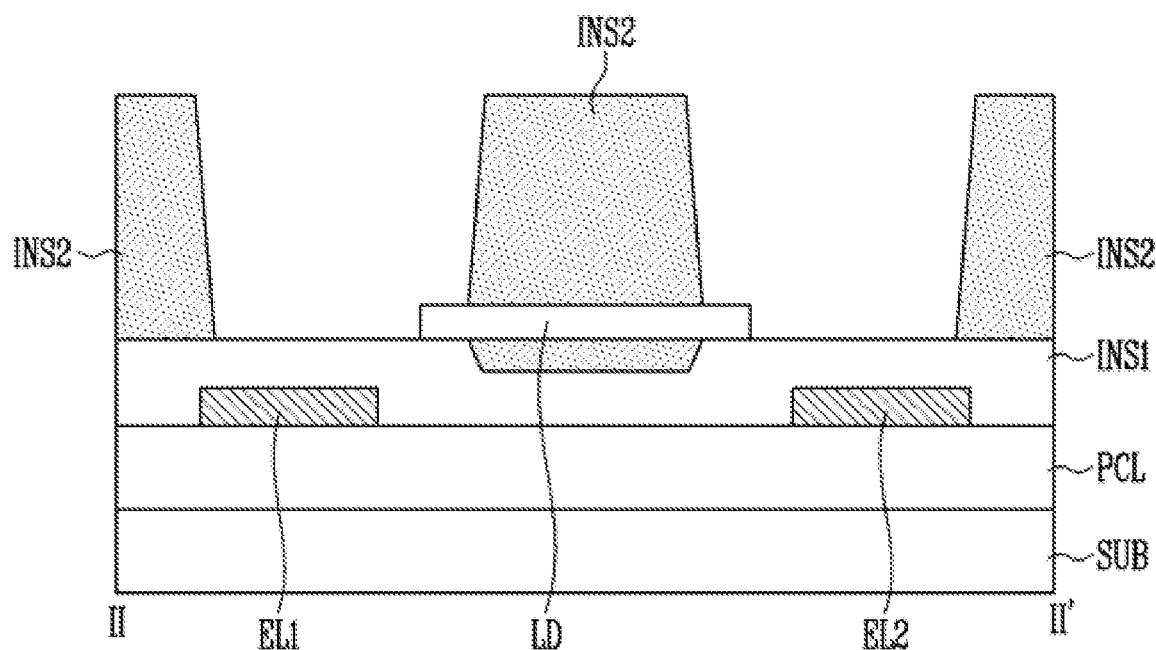
FIGS. 14 to 18 are schematic cross-sectional views of a pixel according to still another embodiment of the specification, respectively showing specific time points while a method of manufacturing the pixel is performed.
Figure 15:
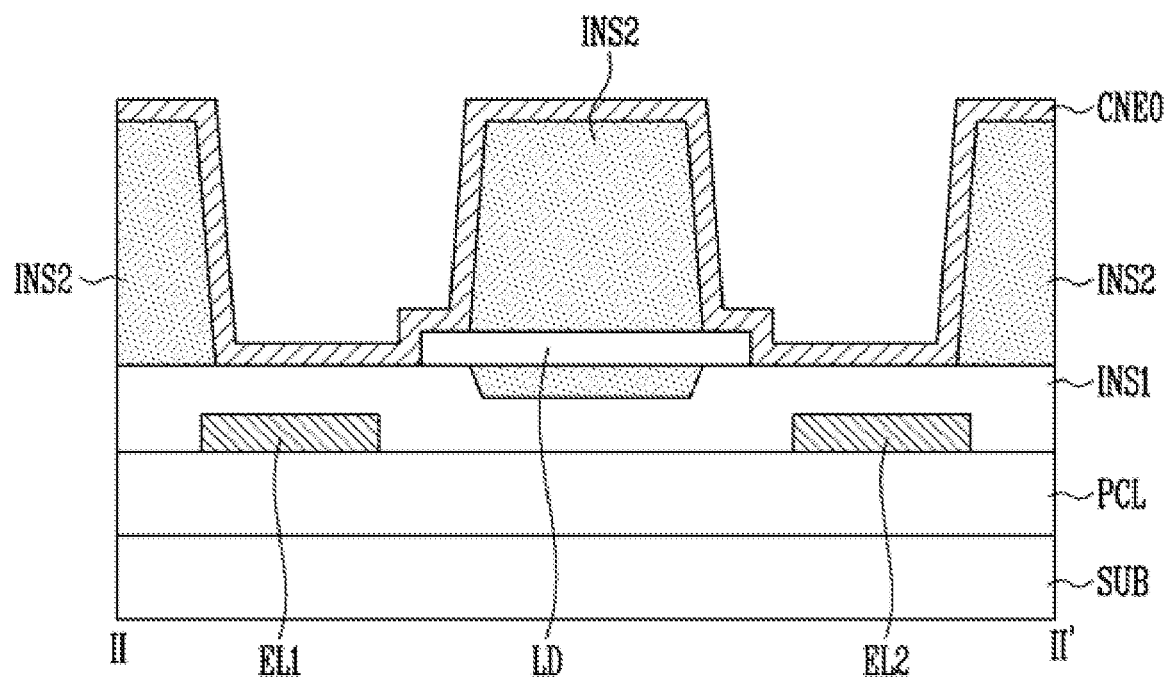
Figure 16:
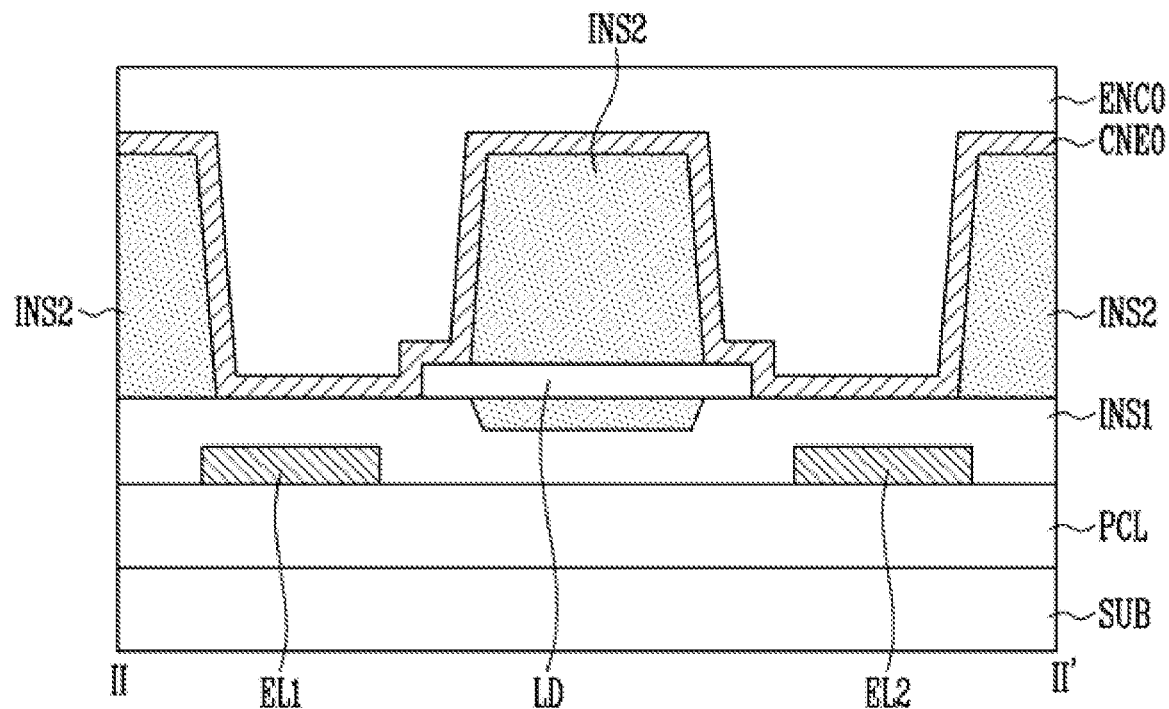

Referring to FIGS. 14 to 16, the pixel circuit unit PCL may be disposed on the substrate SUB, and the first electrode EL1 and the second electrode EL2 may be disposed on the pixel circuit unit PCL. Thereafter, the first insulating film INS1 may be disposed, and the light emitting element LD may be arranged on the first insulating film INS1. Thereafter, the second insulating film INS2 may be formed on the first insulating film INS1 including the light emitting element LD.

After the light emitting elements LD are aligned in the pixel PXL, the second insulating film INS2 may be formed by applying an insulating material layer on the first insulating film INS1 and removing a portion of the insulating material layer using a mask. At least a portion of the second insulating film INS2 may be disposed on the first insulating film INS1 positioned in a region corresponding to the first electrode EL1, and another portion of the second insulating film INS2 may be disposed on the first insulating film INS1 positioned in a region corresponding to the second electrode EL2, and still another portion of the second insulating film INS2 may be disposed on the light emitting elements LD.

After the second insulating film INS2 is formed, the predetermined contact electrode CNE0 may be provided, and then the encapsulation layer ENC0 may be applied on the predetermined contact electrode CNE0.

Figure 17:
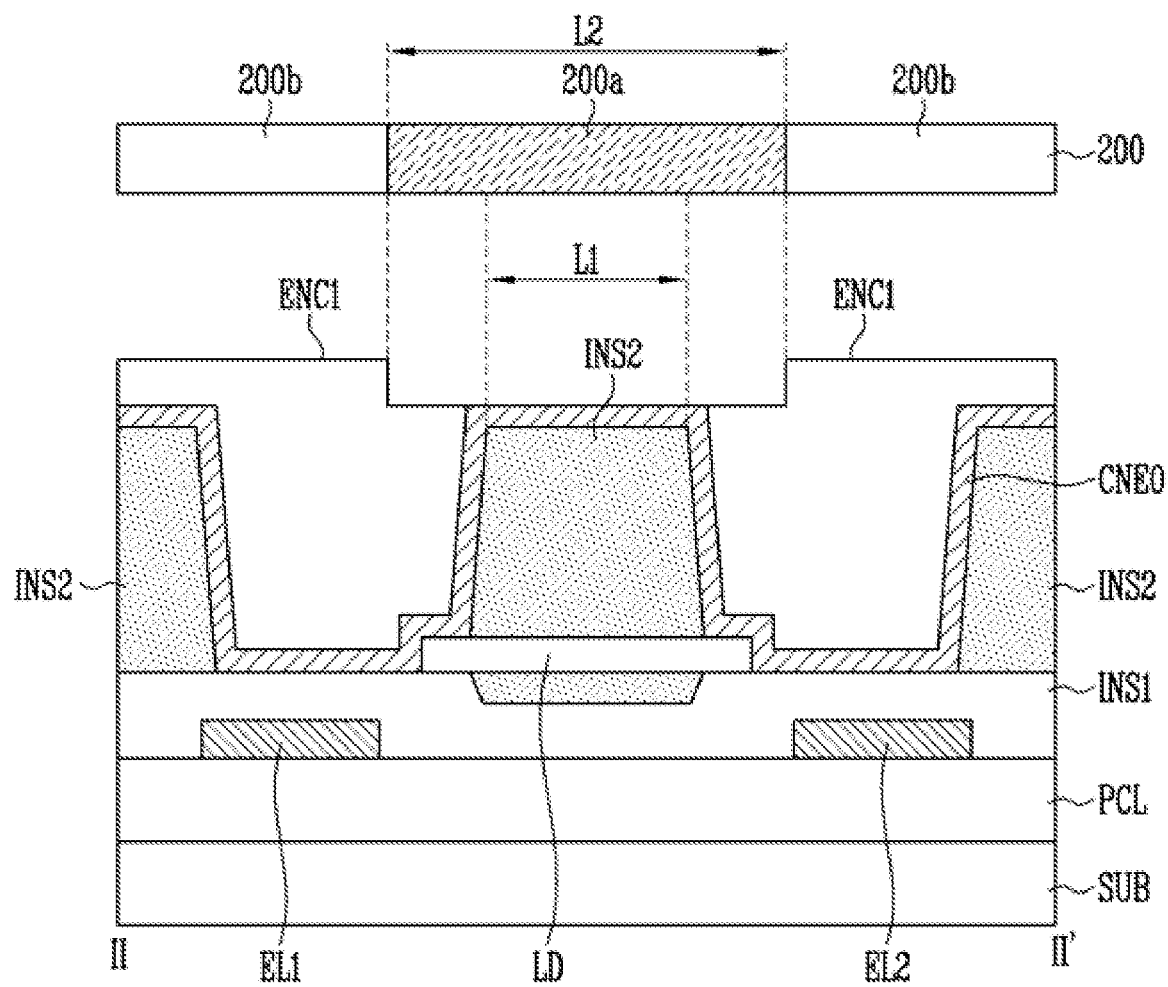

Referring to FIG. 17, a halftone mask 200 may be used in a method of manufacturing a pixel according to still another embodiment of the specification. The halftone mask 200 may include a halftone region 200a and a full-tone region 200b.

A length L1 of the upper surface of the second insulating film INS2 disposed on the light emitting element LD may be at least less than a length L2 of the halftone region 200a corresponding thereto.

Figure 18:
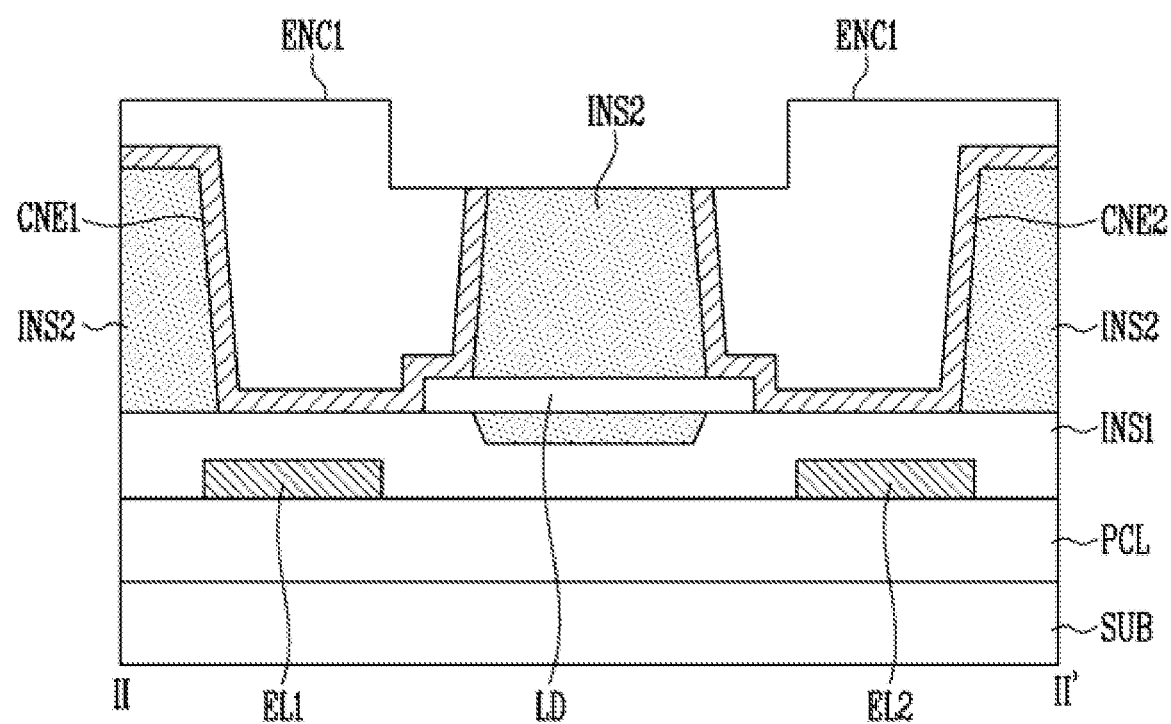

Referring to FIG. 18, according to the embodiment, the second insulating film INS2 disposed on the first insulating film INS1, which is a region other than the light emitting element LD, may function as a reflective member that guides the light emitted from the light emitting elements LD in a desired direction to improve light emission efficiency of the pixel PXL together with the first and second electrodes EL1 and EL2. Therefore, an additional configuration (according to an example, the bank BNK described above with reference to FIG. 12B) for a reflective member may be omitted, and thus process cost may be reduced.

The above description is merely illustrative of the technical spirit of the disclosure, and those skilled in the art to which the disclosure pertains will be able to make various modifications and variations without departing from the essential characteristics of the disclosure. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A pixel comprising:
a first insulating film disposed on a substrate;
a light emitting element disposed on the first insulating film;
a second insulating film disposed on the light emitting element to cover at least a portion of the light emitting element;
a first contact electrode and a second contact electrode, each of the first and second contact electrodes including at least a portion disposed on the first insulating film and electrically connected to the light emitting element; and
an encapsulation layer including a photosensitive material, wherein
each of the first contact electrode and the second contact electrode is disposed on corresponding ones of side surfaces of the second insulating film and is not in contact with each other on an upper surface of the second insulating film, and
the encapsulation layer is disposed on the first contact electrode and the second contact electrode, and
the encapsulation layer is not disposed on the second insulating film.

2. The pixel according to claim 1, wherein the first contact electrode and the second contact electrode are disposed on the light emitting element and are not disposed on the upper surface of the second insulating film.

3. The pixel according to claim 1, wherein
the encapsulation layer includes a first encapsulation region and a second encapsulation region,
the first encapsulation region is adjacent to the second insulating film compared to the second encapsulation region, and
the encapsulation layer in the first encapsulation region, the first contact electrode, and the second contact electrode have a same height.

4. The pixel according to claim 1, wherein
the second insulating film includes a first material, and the pixel further includes:
a third insulating film and a fourth insulating film, each of the third insulating film and the fourth insulating film being disposed on the first insulating film, including the first material, and spaced apart from each other.

5. The pixel according to claim 1, wherein
at least a portion of the first contact electrode is disposed on a first side surface of the second insulating film, and
at least a portion of the second contact electrode is disposed on a second side surface of the second insulating film, the second side surface being opposite to the first side surface.

6. The pixel according to claim 1, wherein
the encapsulation layer, the first contact electrode, the second contact electrode, and the second insulating film are provided by a photolithography process by using a mask including at least a halftone region, and
a region of the upper surface of the second insulating film corresponds to the halftone region of the mask during the photolithography process in a plan view.

7. A display device comprising the pixel according to claim 1.

8. The pixel according to claim 1, wherein a height of the second insulating film with respect to a main surface of the light emitting element is equal to or greater than a height of the first contact electrode and a height of the second contact electrode.

9. The pixel according to claim 8, wherein
the first contact electrode includes a distal end that is in physical contact with the second insulating film and that is spaced apart from the light emitting element,
the second contact electrode includes a distal end that is in physical contact with the second insulating film and that is spaced apart from the light emitting element, and
each of the distal end of the first contact electrode and the distal end of the second contact electrode is spaced apart by an equal distance from the substrate.

10. The pixel according to claim 9, wherein top surfaces between the distal end of the first contact electrode and the distal end of the second contact electrode are parallel to a main surface of the substrate.

11. A pixel comprising:
a first insulating film disposed on a substrate;
a light emitting element disposed on the first insulating film;
a second insulating film disposed on the light emitting element to cover at least a portion of the light emitting element;
a first contact electrode and a second contact electrode, each of the first and second contact electrodes including at least a portion disposed on the first insulating film and electrically connected to the light emitting element; and
an encapsulation layer including a photosensitive material, wherein
each of the first contact electrode and the second contact electrode is disposed on corresponding ones of side surfaces of the second insulating film and is not in contact with each other on an upper surface of the second insulating film,
the encapsulation layer is disposed on the first contact electrode and the second contact electrode,
the second insulating film includes a first material, and
the pixel further includes: a third insulating film and a fourth insulating film, each of the third insulating film and the fourth insulating film being disposed on the first insulating film, including the first material, and spaced apart from each other.

* * * * *